(12) United States Patent
Kimura (10) Patent No.: US 6,469,544 B2
(45) Date of Patent: Oct. 22, 2002

(54) DEVICE FOR DETECTING ABNORMALITY OF CLOCK SIGNAL

(75) Inventor: Naoya Kimura, Chiba (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 0 days.

(21) Appl. No.: 09/855,762

(22) Filed: May 16, 2001

(65) Prior Publication Data

US 2002/0008548 A1 Jan. 24, 2002

(30) Foreign Application Priority Data

May 17, 2000 (JP) .................................. 2000-144371

(51) Int. Cl.[7] .............................................. H03K 5/19
(52) U.S. Cl. .............................. 327/20; 327/8; 327/31
(58) Field of Search ........................... 327/20, 1–3, 8, 327/17, 18, 21, 31, 19–43, 47–49

(56) References Cited

U.S. PATENT DOCUMENTS

| | | | | | |
|---|---|---|---|---|---|
| 4,374,361 A | * | 2/1983 | Holden | ......................... | 327/20 |
| 4,628,269 A | * | 12/1986 | Hunninghaus et al. | ........ | 327/20 |
| 5,138,636 A | * | 8/1992 | Bardin | ....................... | 375/108 |
| 5,165,175 A | * | 11/1992 | Parker et al. | ................. | 377/70 |
| 5,418,481 A | * | 5/1995 | Sikkink et al. | ............... | 327/20 |
| 5,561,390 A | * | 10/1996 | Hiiragizawa | ................ | 327/147 |
| 6,008,671 A | * | 12/1999 | Kang | .......................... | 327/20 |
| 6,222,392 B1 | * | 4/2001 | Guo et al. | .................... | 327/20 |
| 6,246,261 B1 | * | 6/2001 | Monceau | .................... | 326/46 |

FOREIGN PATENT DOCUMENTS

| | | | | |
|---|---|---|---|---|
| JP | 403268513 | * | 11/1991 | .................. 327/20 |
| JP | 06/204993 | | 7/1994 | |
| JP | 08/316946 | | 11/1996 | |

* cited by examiner

*Primary Examiner*—Timothy P. Callahan
*Assistant Examiner*—Hai L. Nguyen
(74) *Attorney, Agent, or Firm*—Rabin & Berdo, P.C.

(57) ABSTRACT

A circuit for detecting abnormality of a subject clock signal, includes a frequency dividing circuit for frequency-dividing a monitoring clock signal to provide a frequency-divided monitoring clock signal; a shift register which stores the frequency-divided monitoring clock signal in synchronization with the subject clock signal; and a plurality of abnormality evaluation circuits. The abnormality evaluation circuits operate complementarily each other in accordance with an output signal of the shift register and detect abnormality of the subject clock signal for a period of time corresponding to the cycle of the monitoring clock signal.

18 Claims, 7 Drawing Sheets

DEVICE FOR DETECTING ABNORMALITY OF CLOCK SIGNAL

CROSS REFERENCE TO RELATED APPLICATION

This application claims the priority of Application No. 2000-144371, filed May 17, 2000 in Japan, the subject matter of which is incorporated herein by reference.

BACKGROUND OF THE INVENTION

1. Field of the Invention

The present invention relates to a clock abnormality detecting circuit for detecting a frequency abnormality state (due to dropout and redundancy) of an externally inputted clock pulse by using an oscillator in a digital communication device (for example, a transmission device).

2. Description of the Related Art

Japanese Patent Laying-Open Publication Kokai No. H06-204993 (hereunder referred to as a first literature) and Japanese Patent Laying-Open Publication Kokai No. H08-316946 (hereunder referred to as a second literature) disclose conventional circuits for detecting clock abnormalities, especially, clock interruptions. Hereinafter, the conventional circuits disclosed in FIGS. 1 to 3 of the first literature and FIGS. 1 and 6 to 8 of the second literature are briefly described.

First, the conventional circuit employing a monostable multi-vibrator sets a time constant, which is determined by a capacitor C and a resistor R, and provides a pulse a having a pulse width with a value that is larger than the period of a subject clock signal. Thus, as long as the clock signal is inputted thereto, an output value of the multivibrator is maintained at one level, for example, at a high potential level (hereunder referred to H-level). At the suspension of a clock signal, the output value is changed to a low potential level (hereunder referred to as L-level). In the case of such a kind of a circuit, when the output value of the multivibrator is at L-level, it is determined that the clock signal is in an interrupted state.

Further, another conventional circuit having two counters is configured so that a clock signal subject is inputted to one of the counters, while a reference clock signal is inputted to the other counter, and that outputs of the counters are monitored by a comparator. In this case, the comparator monitors a counting-up operation performed in the counter and measures intervals, at which the counting-up operation is performed, according to a count value outputted from the latter counter. Incidentally, in the case that the counting-up operation is not performed for a certain time, it is determined that the former clock signal is suspended.

Moreover, another conventional circuit is configured in such a way as to use subject clock signals as reset signals and have a counter, which is connected and adapted to count reference clock signals, and to generate an output, which indicates the suspension of the subject clock signals, when a predetermined number of reference clock signals are inputted thereto during the interruption of the subject clock signals.

Furthermore, the detection of interruption of clock signals is performed mainly by the following conventional methods. That is, one of such conventional methods comprises the step of monitoring a subject clock signal every constant period by using a monitoring clock signal in the case that the monitoring clock signal is asynchronous to the subject clock signal and that the monitoring clock signal and the subject clock signal are inputted at the same rate, and the step of determining, when subject clock signals are not inputted thereto in the constant period at all, that the interruption of the clock occurs. Another conventional method comprises the step of detecting an edge of a subject clock signal in the case that the monitoring clock signal is asynchronous to the subject clock signal and that the subject clock signal is inputted at a rate lower than a rate at which the monitoring clock signal is inputted, and the step of determining, when a cycle of detection of an edge of the subject clock signal is longer than a preset value, an occurrence of the interruption of the clock signal. Still another conventional method is to configure a detection circuit in such a way as to comprise a frequency dividing means for generating, when interruption of a subject clock signal, which is asynchronous to a monitoring clock signal and inputted thereto at the same rate as a rate at which the monitoring clock signals is inputted, is detected, n series of frequency divided subject clock signals, whose change points are sequentially shifted by dividing the frequency of the subject clock signal by n, and a clock interruption detecting means for detecting the presence or absence of a change point of the frequency divided subject clock signal by using the monitoring clock signal and for sensing interruption of the subject clock every duration of a monitoring control signal according to a result of detecting the presence or absence of a change point.

The aforementioned conventional methods, however, have the following disadvantages or drawbacks.

That is, the conventional methods have, for example, a drawback in that the capacitor C and the resistor R to be added to the multi-vibrator render the detection circuit unfit for integration thereof. Moreover, the. conventional method of determining the suspension of the clock signal by making comparison between outputs of the counters enabled to operate independent of each other according to two asynchronous clock signals has drawbacks in that the internal configuration of the comparing circuit is extremely complex, and that the comparing circuit lacks precision.

SUMMARY OF THE INVENTION

According to a first clock abnormality detecting circuit of the invention, a shift register is used for detecting abnormalities in a subject clock signal. It is determined according to data, which represents a result of sampling of a monitoring clock signal according to the subject clock signal and is outputted from each of the columns or stages of the shift register, whether or not the subject clock signal is normal. Thus, the number of change points is reduced. Consequently, the gate size of the clock abnormality detecting circuit is decreased. Moreover, the power consumption thereof is lowered.

According to a second clock abnormality detecting circuit of the invention, similarly as in the case of the first clock abnormality detecting circuit, a shift register is used for detecting abnormality of the subject clock signal. It is determined according to data, which represents a result of sampling of a monitoring clock signal according to the subject clock signal and is outputted from each of the columns or stages of the shift register, whether or not the subject clock signal is normal. Thus, the second clock abnormality detecting circuit has advantageous effects similar to those of the first clock abnormality detecting circuit.

Even in the case of the third clock abnormality detecting circuit of the invention, which is obtained by reversing the relation between the monitoring clock signal and the subject clock signal in the first or second clock abnormality detecting circuit of the invention, advantageous effects similar to those of the first or second clock abnormality detecting circuit are obtained.

In the case of the fourth clock abnormality detecting circuit of the invention, which has a normal value detecting circuit, which is operative to detect a normal output state in accordance with an output state of each of the columns of the shift register, and an abnormal value detecting circuit, which is operative to detect in accordance with the output state of each of the columns of the shift register an abnormal clock input value that exceeds the value indicated by a normal input, as abnormality evaluation circuits for the first, second or third clock abnormality detecting circuit of the invention, the most fundamental circuit configuration is realized.

In the case of the fifth clock abnormality detecting circuit having a plurality of normal value detecting circuits, which differ from one another in conditions for regarding a state as a normal one and are operative to detect a normal state in accordance with output states of each of columns of the shift register, a storage means for storing one of results of detection performed by the plurality of normal value detecting circuits and an abnormal value detecting circuit for detecting an abnormal clock input value that exceeds a normal input value, as components of one of the abnormality evaluation circuits of the first, second, or third clock abnormality detecting circuit of the invention, and also having a plurality of normal value detecting circuits, which differ from one another in conditions for regarding a state as a normal one and are operative to detect a normal state in accordance with output states of each of columns of the shift register and which are adapted so that only the normal value detecting circuits directed to a detection of a normal output state on a condition differing from the conditions for regarding a state as a normal one according to a result stored in the storage means provided in the one of the abnormality evaluation circuits, and an abnormal value detecting circuit for detecting in accordance with an output state of each of columns of the shift register an abnormal clock input value that exceeds a normal input value as components of the abnormality evaluation circuit other than the one of the abnormality. evaluation circuits thereof, the configuration of the circuit dealing with the case, in which a plurality of normal states are present, is realized.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which.

Figure 1:
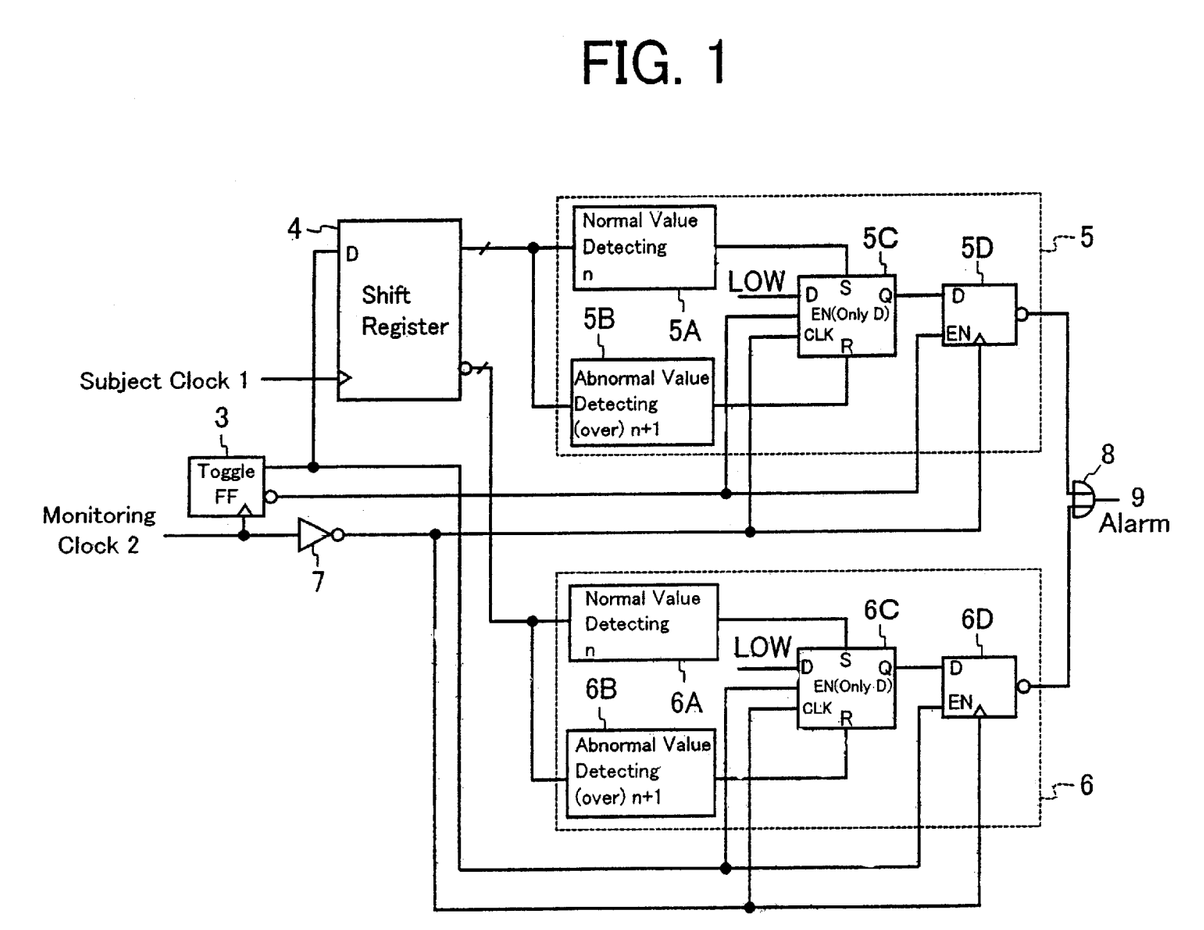
FIG. 1 is a functional block diagram illustrating a clock abnormality detecting circuit that is a first embodiment of the invention.

DETAILED DESCRIPTION OF THE PREFERRED EMBODIMENTS (A) First Embodiment (A-1) Device Configuration FIG. 1 shows a first embodiment of the invention. Incidentally, FIG. 1 functionally illustrates the circuit configuration of a clock abnormality detecting circuit embodying the invention.

A subject clock signal 1 is connected to an input terminal of a shift register 4 (consisting of multiple columns, or stages, of D-flipflops). Outputs of the shift register 4 are provided at an output port that is connected to input terminals or ports of a normal value detecting circuit 5A and an abnormal value detecting circuit 5B of an abnormality evaluation circuit 5 (comprising the normal value detecting circuit 5A, the abnormal value detecting circuit 5B, an SR flipflop 5C, and a D-flipflop 5D). The output of the abnormal evaluation circuit 5 is connected to an OR-circuit 8. The output of the OR-circuit 8 is connected to an alarm circuit 9.

On the other hand, a monitoring clock signal 2 is connected to a clock input terminal of a frequency dividing circuit 3 (constituted by a T-flipflop) and to a clock signal inverting device 7. Positive outputs of the frequency dividing circuit 3 are supplied to a data input terminal of the shift register 4, and to the data enable input terminals of an SR-flipflop 6C and a D-flipflop 6D of an abnormality evaluation circuit 6 (comprising a normal value detecting circuit 6A, an abnormal value detecting circuit 6B, the SR-flipflop 6C, and the D-flipflop 6D). Negative outputs of the frequency dividing circuit 3 are connected to the data enable terminals of the SR-flipflop 5C and the D-flipflop SD of the abnormality evaluation circuit 5.

Outputs of the clock signal inverting device 7 are connected to the clock signal input terminals of the SR-flipflops 5C and 6C and the D-flipflops 5D and 6D of the abnormality evaluation circuits 5 and 6.

This embodiment is configured in such a way as to have the aforementioned typical functional blocks. Next, the configuration of each of the abnormality evaluation circuits 5 and 6 is described hereinbelow. Incidentally, needless to say, this circuit configuration is a mere example. That is, the invention is not limited to this circuit configuration.

First, the configuration of the abnormality evaluation circuit is described hereunder. As described above, the abnormality evaluation circuit 5 has the normal value detecting circuit 5A, the abnormal value detecting circuit 5B, and the SR-flipflop 5C, and the D-flipflop 5D.

Incidentally, in the case that the number of columns of the D-flipflops of the shift register 4 is (n+1), the normal value detecting circuit 5A is an operational circuit for computing the AND of all outputs of the D-flipflops placed at the first to nth columns (that is, the nth column is used for detecting a normal value n).

On the other hand, in the case that the number of columns of the D-flipflops of the shift register 4 is (n+1), the abnormal value detecting circuit 5B is an operational circuit for computing the AND of all outputs of the D-flipflops placed at the first to (n+1)th columns (that is, the (n+1)th column is used for detecting a normal value n).

The SR-flipflop 5C is a circuit that employs an output of the normal value detecting circuit 5A as a set input thereto, and that also employs an output of the abnormal value detecting circuit 5B as a reset input thereto. Incidentally, a fixed voltage (having L-level in this case) is inputted to the data input terminal of this circuit. Moreover, a negative output of the frequency dividing circuit 3 is inputted to the D-input enable terminal thereof. Furthermore, an output of the clock signal inverting device 7 is inputted to the clear terminal thereof.

The D-flipflop 5D is a circuit that employs an output of the SR-flipflop 5C as a data input thereto. Incidentally, a negative output of the frequency dividing circuit 3 is inputted to the enable terminal thereof. Further, an output of the clock signal inverting device 7 is inputted to the clock input thereto. Data obtained by inverting an output of the D-flipflop 5D is inputted to one of the input terminals of the AND-circuit 8.

Thus, each of the SR-flipflop 5C and the D-flipflop 5D operates by employing the monitoring clock signal 2 (operated by being delayed by(½)-cycle) as an operating clock signal. Further, a half-cycle of the frequency-divided output is employed as an operating period thereof.

Next, the configuration of the abnormality evaluation circuit 6 is described hereinbelow. As described above, the abnormality evaluation circuit 6 has the normal value detecting circuit 6A, the abnormal value detecting circuit 6B, the SR-flipflop circuit 6C, and the D-flipflop circuit 6D. This configuration is the same as of the abnormality evaluation circuit 5. This circuit 6 differs from the circuit 5 in respects related to the input signals.

For instance, in the case that the number of the columns or stages of D-flipflops of the shift register 4 is (n+1), the normal value detecting circuit 6A is an operational circuit for computing AND of all the outputs of the D-flipflops placed at the first to nth column (incidentally, the nth column is used for detecting the normal value n). Incidentally, although the input port of the normal value detecting circuit 5A is connected to an output port of the shift register 4, it is the negative (or complemented) output port, and the input to the normal value detecting circuit 6A is the negative output of the shift register 4.

Further, in the case that the number of the columns of D-flipflops of the shift register 4 is (n+1), an operational circuit used for computing AND of all the outputs of the D-flipflops placed at the first to (n+1)th column (incidentally, the (n+1)th column is used for detecting an overflow) is used as the abnormal value detecting circuit 6B. Incidentally, the input to the abnormal value detecting circuit 6B is a negative output of the shift register 4.

The SR-flipflop 6C is a circuit that employs an output of the normal value detecting circuit 6A as the set input thereto, and that also employs an output of the abnormal value detecting circuit 6B as the reset input thereto. Further, a fixed voltage (having L-level in this case) the data input thereto. Moreover, an output of the clock signal inverting device 7 is inputted to the clear terminal thereof. The connection there among is the same as that in the case of the SR-flipflop 5C of the abnormality evaluation circuit 5. The circuits 5A and 5B differ from each other in that a positive output of the frequency dividing is inputted to the D-input enable terminal of the circuit 6C.

The D-flipflop 6D is a circuit that employs an output of the SR-flipflop 6C as the data input thereto. Incidentally, the flipflop 6D differs from the D-flipflop 5D of the abnormality detecting circuit 5 only in that a positive output of the frequency dividing circuit 3 is inputted to the enable terminal thereof. Further, data obtained by inverting an output of the D-flipflop 6D is inputted to the other input terminal of the logical sum computing circuit 8.

Thus, each of the SR-flipflop 6C and the D-flipflop 6D operates by employing the monitoring clock signal 2 (operated by being delayed by(½)-cycle) as an operating clock signal. Further, a half-cycle of the frequency-divided output (that is, a dead time of the abnormality evaluation circuit 5) is employed as an operating period thereof.

(A-2) Abnormality Detecting Operation

This clock abnormality detecting circuit enables the detection of abnormality of a clock signal, which includes the interruption of a clock signal, every cycle of the clock signal even in the case that the subject clock signal and the monitoring clock are asynchronous to each other and that the subject clock signal is higher in frequency than the monitoring clock.

It is preferable for simply enabling the detection of abnormality of a clock signal that the cycle of the monitoring clock signal is set at a value equal to the cycle of the frequency-divided subject clock signal. Thus, the. following description is given by assuming that the cycle of the monitoring clock signal is equal to the cycle of the. subject clock signal, whose frequency is divided by 8.

Figure 2:
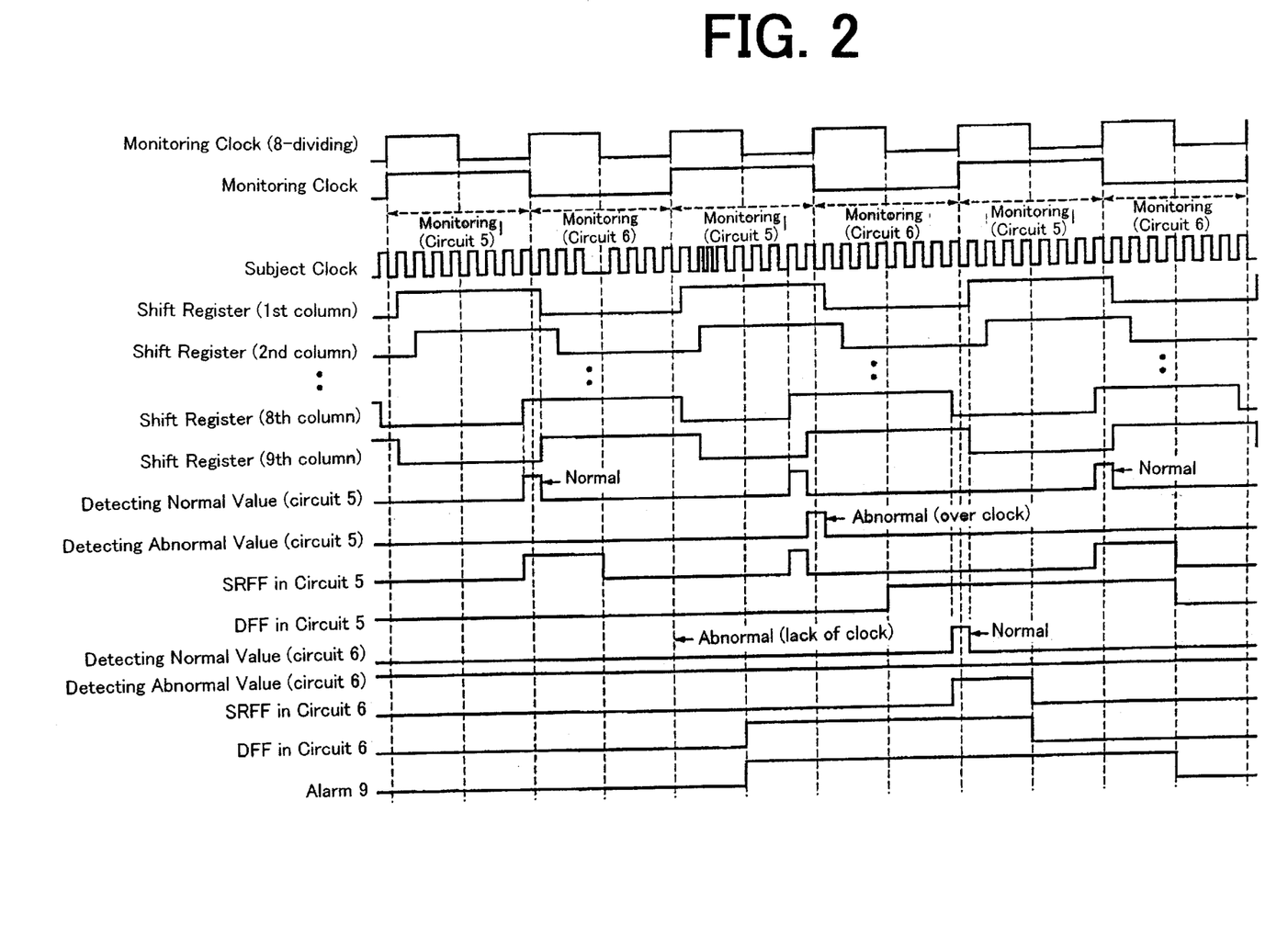
FIG. 2 is a time chart illustrating an operation of the first embodiment of the invention.

FIG. 2 is a time chart illustrating an operation of the circuit configured as illustrated in FIG. 1 on such an assumption. As is shown on the first and third lines of FIG. 2 from the top thereof, the cycle of the monitoring clock signal 2 is equal to that of the subject clock signal 1 whose frequency is divided by 8.

Therefore, even in the shift register 4, the number of columns of this register is set at 9 (=8+1).

(a) Reset Mode

Although not shown in this figure, the outputs of all the stages of the shift register 4 are "0" when reset. At that time, an output of the abnormality evaluation circuit 5 causes issuance of a clock interruption alarm (that is, the negative logical output of the D-flipflop indicates a logical value "1"). Further, an output of the frequency dividing circuit 3 for frequency-dividing a monitoring clock signal indicates "0". Therefore, another circuit configured in such a manner as to prevent an alarm from being issued on resetting the register is provided in a communication unit.

(b) Normal Mode

After the resetting is canceled, an output of the frequency. dividing circuit for frequency-dividing the monitoring clock signal is changed from "0" to "1" by inputting the monitoring clock 2. Further, data representing a result of frequency division of the monitoring clock signal is sequentially inputted to the shift register 4 by inputting the subject clock signal 1 thereto.

When the subject clock signal 1 is normally inputted thereto, data "1" is inputted to the first to eighth columns of the shift register 4 in response to the input of the subject clock signal 1.

At that time, in the case that the normal value detecting circuit 5A is an operational circuit for computing AND of all outputs of the first to eighth columns of the shift register 4, the value indicated by the normal value detecting circuit 5A of the abnormal evaluation circuit 5 is "1" during one cycle of the subject clock signal 1. Then, the SR-flipflop 5C is set and indicates "1".

Furthermore, at that time, in the case that the abnormal value detecting circuit 5B is, for instance, an operational circuit for computing AND of all outputs of the first to ninth columns of the shift register 4, because the circuit is in a normal mode in this case, an output of the first column of the shift register 4 is "0" (owing to the fact that the result of the frequency-dividing the monitoring clock signal is "0") when the next subject clock signal 1 is inputted thereto. Thus, the abnormal value detecting circuit 5B performs no operation.

On the other hand, at that time, negative logical resultant outputs of all the columns of the shift register 4 are connected to the abnormality evaluation circuit 6, so that the abnormality evaluation circuit 6 performs no operation. For example, when a preceding value is abnormal like a value taken just after the resetting is canceled, this value remains abnormal. When the preceding value is normal, this value remains normal.

Next, consider the case that "0" is inputted to the first to eighth columns of the shift register 4 by inputting the subject clock signal 1 thereto. At that time, all the negative logical outputs of the first to eighth columns of the shift register 4 are "1", so that outputs thereof to the normal value detecting circuit 6A of the abnormality evaluation circuit 6 are "1" during one cycle of the subject clock signal. Thus, the SR-flipflop 6C is set and outputs "1". At that time, the abnormality evaluation circuit 5 performs no operation.

Incidentally, when the frequency-divided output of the monitoring clock signal 2 is "0", the SR flipflop 5C and the D-flipflop 5D, to each of which the value obtained by inverting such a value is inputted, of the abnormality evaluation circuit 5 are data-enabled ones. A result of the operation of the SR-flipflop 5C is shifted to the D-flipflop 5D at the trailing edge of the monitoring clock signal 2. The SR-flipflop 5C is cleared. Consequently, the negative logical output of the D-flipflop 5D becomes "0".

Conversely, when the outputted frequency-divided monitoring clock signal 2 indicates "1", the SR-flipflop 6C and the D-flipflop 6D of the abnormality evaluation circuit 6 become data-enabled ones. A result of the operation of the SR-flipflop 6C is shifted to the D-flipflop 6D at the trailing edge of the monitoring clock signal 2. The SR-flipflop 6C is cleared. Consequently, the negative logical output of the D-flipflop 6D becomes "0".

At that time, the OR circuit 8 outputs a logical sum of negative logical outputs of the D-flipflops of the abnormality evaluation circuits. Thus, when a normal value is detected, the alarm circuit 9 indicates "0". Thus, it is determined that the monitored clock signal is normal. That is, the abnormality evaluation circuit 5 monitors the clock signal in a I monitoring interval of one cycle during which a resultant output of the frequency-divided monitoring. clock 2 represents "1". The abnormality evaluation circuit 6 monitors the clock signal in a monitoring interval of one cycle during which a resultant output of the frequency-divided monitoring clock 2 represents "0".

(c) Abnormal Mode

In an abnormal mode in which the number of clock signals is small, for instance, in the case that only 7 subject clock signals are present during a time period in which the outputted frequency-divided monitoring clock signal 2 indicates "0", "1" is inputted only to the first to seventh columns of the shift register 4 when the subject clock signals 1 are inputted. Thus, the normal value detecting circuit 6A does not sets the SR-flipflop 6C at "1". Needless to say, the abnormal value detecting circuit 6B does not operate. When the monitoring clock signal 2 changes to "1" in this state, the negative logical resultant output of the D-flipflop 6D becomes "1" at the trailing edge thereof. The abnormal value is maintained until the monitoring clock signal 2 changes to "0" the next time and the value is changed to a normal one. Thus, the alarm circuit 9 indicates "1".

In contrast, in the case of an abnormal mode in which the number of clock signals is large, for example, in the case that 9 subject clock pulses are present during the output frequency-divided monitoring clock signal 2 represents "1", the value "1" is inputted to the first to ninth columns of the shift register 4 in response to the input of the subject clock signal 1. In this case, when "1" is inputted to the first to eighth columns of the shift register 4, the normal value detecting circuit 5A sets the SR-flipflop 5C at "1". However, this flipflop is reset according to a detection output of the abnormal value detecting circuit 5B, so that the output of the SR-flipflop 5C is returned to "0". When the monitoring clock 2 changes to "0" in this state, the negative logical resultant output of the D-flipflop 5D becomes "1" at the trailing edge of the monitoring clock signal 2. The abnormal value is maintained until the monitoring clock 2 becomes "1" the next time and is in a normal mode. The alarm circuit 9 indicates "1".

Further, when an interruption or abnormality of the clock signal occurs, for example, when the value "1" is not inputted to the shift register 4 during the output frequency-divided monitoring clock 2 indicates "1", the normal value detecting circuit 5A does not set the SR-flipflop 5C at "1". Thus, the abnormal mode is maintained until the value represented by the monitoring clock signal 2 becomes "1", which is a normal one, the next time. Consequently, the value indicated by the alarm circuit 9 becomes "1".

Incidentally, after the abnormal value is detected, the state of the clock signal is not returned to a normal state when a normal monitoring clock signal is inputted thereto during (5/2)cycles of the cycle of the monitoring clock signal.

(A-3) Advantages of First Embodiment

As described above, according to the first embodiment of the invention, the detecting circuit comprises the shift register 4, which operates according to the subject clock signal and receives resultant frequency-divided monitoring clock signals and the two abnormal evaluation circuits 5 and 6 that employ one cycle of the monitoring clock signal as the monitoring interval. Further, the two abnormality evaluation circuits alternately perform an. operation of inputting a signal outputted from the single shift register thereto and monitoring the outputted signal during the monitoring clock signal indicates "0" or "1". Consequently, the detecting circuit always monitors and detects an occurrence of abnormality of the clock signal.

Moreover, the first embodiment has only to include only one means for counting the subject clock signals. Additionally, this means is constituted by the shift register 4. Therefore, it is sufficient that the number of change points subject is only 1 or 2.

Furthermore, in the case of the interruption of the clock signal, the abnormality evaluation circuit does not operate after it is determined that an abnormality of the clock signal occurs. Thus, as compared with the conventional clock abnormality detecting circuits, the gate size and the power consumption of the detecting circuit according to the first embodiment are reduced. Moreover, an abnormality of a clock signal is always detected at a high frequency close to an upper-limit frequency for the register in view of the device ability thereof.

(B) Second Embodiment (B-1) Device Configuration

Figure 3:
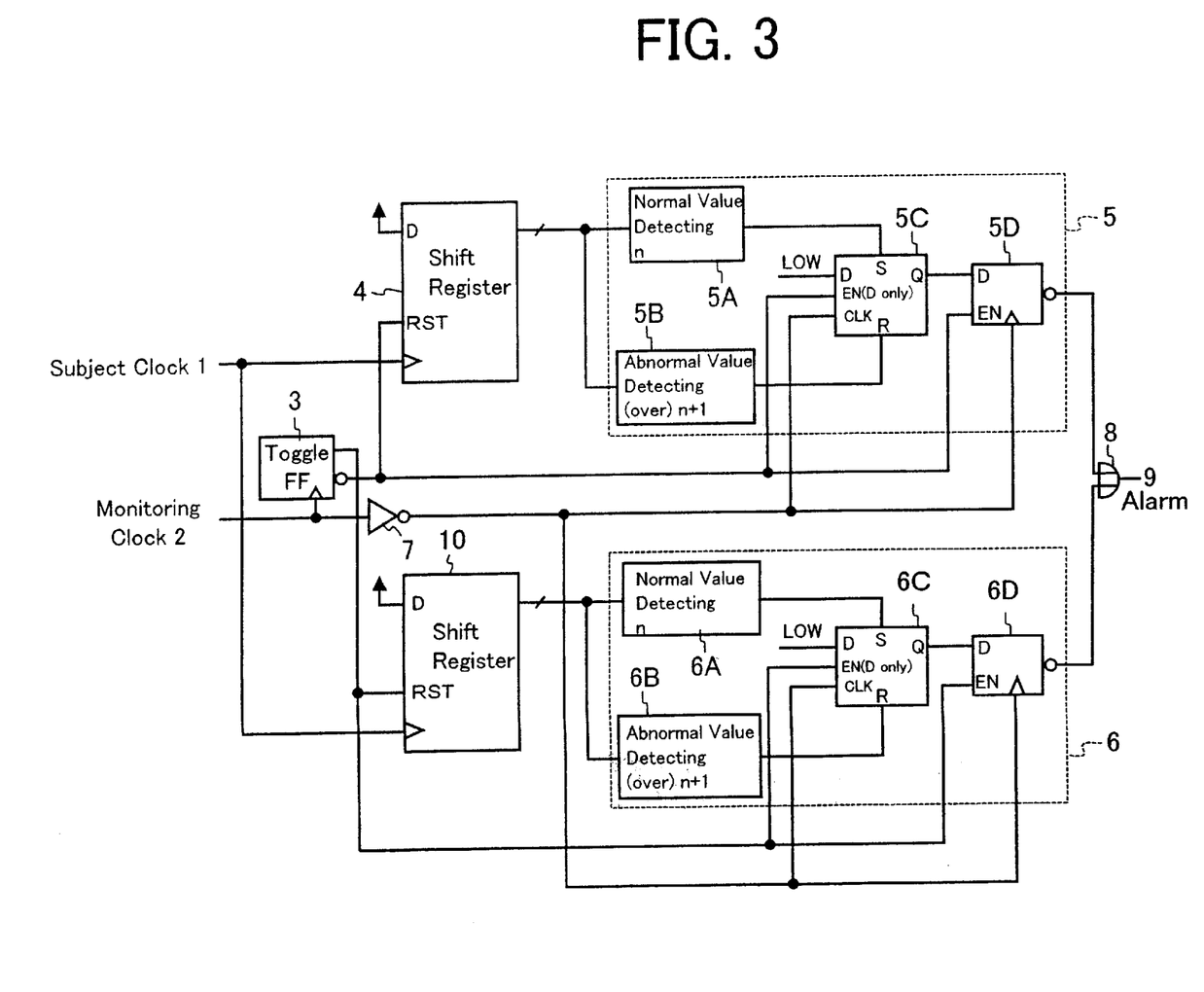
FIG. 3 is a functional block diagram illustrating another clock abnormality detecting circuit that is a second embodiment of the invention.

FIG. 3 shows a second embodiment of the invention. Incidentally, FIG. 3 functionally illustrates the circuit configuration of a clock abnormality detecting circuit embodying the invention, similarly as FIG. 1. Although it is described in the foregoing description of the first embodiment that the single shift register is provided in the circuit, a shift register 10 is added to the circuit in the second embodiment of the invention. Thus, the second embodiment of the circuit configuration having two shift registers is described hereinbelow.

In the case of this embodiment, the subject clock signal 1 is connected to the clock input terminal of the shift register 4. A fixed a value of "1" or "0" is connected to the data input terminal of the shift register 4. The negative logical resultant output thereof representing the frequency-divided monitoring clock signal 2 is connected to the reset input terminal thereof, at which all the columns of the shift register 4 are set at "0" when the output represents "1". A positive logical resultant output of the shift register 4 is connected to the positive value detecting circuit 5A and the abnormal value detecting circuit 5B.

Further, the subject clock signal 1 is also connected to the clock input terminal of the shift register 10. A fixed value of "1" or "0" is connected to the data input terminal of the shift register 10. The positive logical resultant output thereof representing the frequency-divided monitoring clock signal 2 is connected to the reset input terminal thereof, at which all the columns of the shift register 10 are set at "0" when the output represents "1". A positive logical resultant output of the shift register 10 is connected to the positive value detecting circuit 6A and the abnormal value detecting circuit 6B of the abnormality evaluation circuit 6.

Incidentally, the same circuits as used in the first embodiment are employed as the abnormality evaluation circuits 5 and 6. Additionally, as described above, the input data connected thereto differ from each other. An output of the shift register 4 is inputted to the abnormality evaluation circuit 5. An output of the shift register 10 is inputted to the abnormality evaluation circuit 6. Furthermore, the reset cycles of the shift registers 4 and 10 are established so that outputs of these registers are of opposite phases. Thus, the time periods, in which outputs signals are generated, of the shift registers 4 and 10 are complementary to each other.

The rest of the configuration of the second embodiment is similar to the corresponding part of the configuration of the first embodiment of the invention.

(B-2) Abnormality Detecting Operation

This clock abnormality detecting circuit also enables the detection of abnormality of a clock signal, which includes the interruption of a clock signal, every cycle of the clock signal even in the case that the subject clock signal and the monitoring clock are asynchronous to each other and that the subject clock signal is higher in frequency than the monitoring clock.

Even in the case of this clock abnormality detecting circuit, the following description is given by assuming that the cycle of the monitoring clock signal is equal to the cycle of the subject clock signal, whose frequency is divided by 8, similarly as in the case of the first embodiment.

Figure 4:
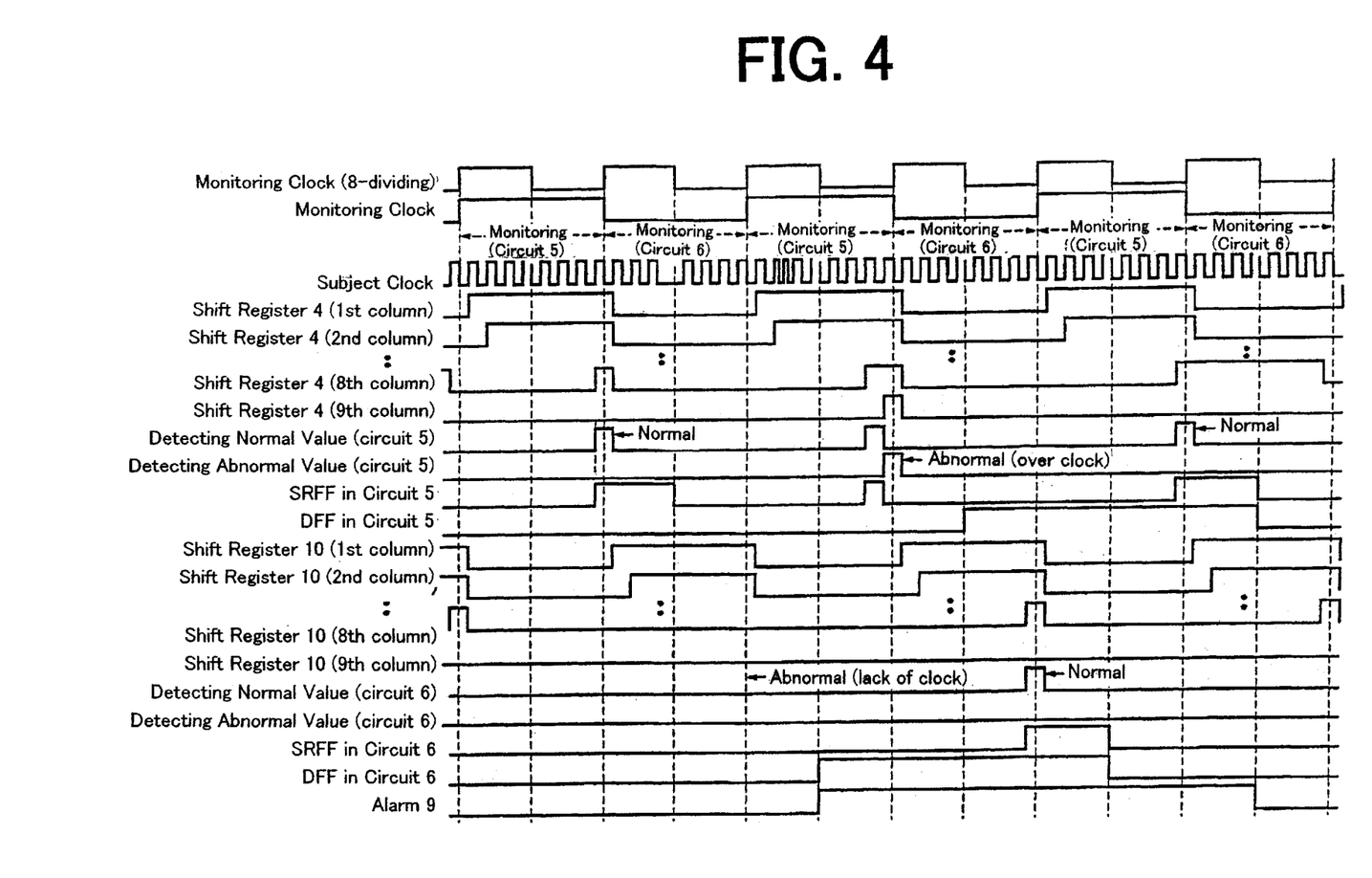
FIG. 4 is a time chart illustrating an operation of the second embodiment of the invention.

FIG. 4 is a time chart illustrating an operation of the circuit configured as illustrated in FIG. 3 on such an assumption. As is shown on the first and third lines of FIG. 4 from the top thereof, the cycle of the monitoring clock signal 2 is equal to that of the subject clock signal 1 whose frequency is divided by 8.

Therefore, in the case of each of the shift registers 4 and 10, the number of columns of this register is assumed to be set at 9 (=8+1).

(a) Reset Mode

Although not shown. in this figure, outputs of all columns of the register 4 are "0" when reset. At that time, an output of the abnormality evaluation circuit 5 causes issuance of a clock interruption alarm (that is, the negative logical output of the D-flipflop 5D indicates a logical value "1"). Further, an output of the frequency dividing circuit 3 for frequency-dividing a monitoring clock signal indicates "0". Therefore, another circuit configured in such a manner as to prevent an alarm from being issued on resetting the register is provided in a communication unit.

(b) Normal Mode

After the resetting is canceled, an output of the frequency dividing circuit for frequency-dividing the monitoring clock signal is changed from "0" to "1" by inputting the monitoring clock 2. At that time, the shift register 10 is reset. On the other hand, data representing. a result of frequency division of the monitoring clock signal is sequentially inputted to the data input terminal of the shift register 4 by inputting the subject clock signal 1 thereto.

When the subject clock signal 1 is normally inputted thereto, data "1" is inputted to the first to eighth columns of the shift register 4 in response to the input of the subject clock signal 1. For example, when the normal value detecting circuit 5A and the abnormal value detecting circuit 5B are leading-edge or trailing-edge detecting circuits, the value indicated by the normal value detecting circuit 5A of the abnormal evaluation circuit 5 is "1" during one cycle of the subject clock signal 1. Then, the SR-flipflop 5C is set and indicates "1".

Incidentally, this case is in the normal mode, so that at the next input of the subject clock signal 1, the result of the frequency division of the monitoring clock 2 is inverted. Thus, all the columns of the shift register 4 are reset to "0". In this case, there are no edges, so that the abnormal value detecting circuit 5B performs no operation.

On the other hand, at that time, an output of the shift register 10 is connected to the abnormality evaluation circuit 6, which does not operate at all because of the absence of edges. For example, when the preceding value is abnormal like a value taken just after the resetting is canceled, this value remains abnormal. When the preceding value is normal, this value remains normal.

Next, consider the case that an output of the monitoring clock frequency division circuit 3 changes from "1" to "0" by inputting the monitoring cock signal 2 thereto. In this case, the shift register 4 is reset, while data "1" or "0" is sequentially inputted to the data input terminal of the shift register 10 by inputting the subject clock signal 1 thereto.

At that time, the data "1" or "0" are inputted the first to eighth columns of the shift register 10 by inputting the subject clock signal 1 thereto are "1", so that outputs thereof to the normal value detecting circuit 6A of the abnormality evaluation circuit 6 are "1" during one cycle of the subject clock signal. Thus, the SR-flipflop 6C is set and outputs "1".

Incidentally, because this is a normal case, so that at the next input of the subject clock signal 1, the result of the frequency division of the monitoring clock 2 is inverted. Thus, all the columns of the shift register 10 are reset to "0". In this case, there are no edges, so that the abnormal value detecting circuit 6B performs no operation.

On the other hand, at that time, an output of the shift register 4 is connected to the abnormality evaluation circuit 5, which does not operate because the register 4 is reset. That is, the abnormality evaluation circuit 5 does not operate at all and holds the preceding value.

Incidentally, when the frequency-divided output of the monitoring clock signal 2 is "0", the SR flipflop 5C and the D-flipflop 5D, to each of which the value obtained by inverting such a value is inputted, of the abnormality evaluation circuit 5 are data-enabled ones. A result of the operation of the SR-flipflop 5C is shifted to the D-flipflop 5D at the trailing edge of the monitoring clock signal 2. The SR-flipflop 5C is cleared. Consequently, the negative logical output of the D-flipflop 5D becomes "0".

Conversely, when the outputted frequency-divided monitoring clock signal 2 indicates "1", the SR-flipflop 6C and the D-flipflop 6D of the abnormality evaluation circuit 6 become data-enabled ones. A result of the operation of the SR-flipflop 6C is shifted to the D-flipflop 6D at the trailing edge of the monitoring clock signal 2. The SR-flipflop 6C is cleared. Consequently, the negative logical output of the D-flipflop 6D becomes "0".

At that time, the OR circuit 8 outputs a logical sum of negative logical outputs of the D-flipflops of the abnormality evaluation circuits. Thus, when a normal value is detected, the alarm circuit 9 indicates "0". Thus, it is determined that the monitored clock signal is normal. That is, the abnormality evaluation circuit 5 monitors the clock signal in a monitoring interval of one cycle during which a resultant output of the frequency-divided monitoring clock 2 represents "1". The abnormality evaluation circuit 6 monitors the clock signal in a monitoring interval of one cycle during which a resultant output of the frequency-divided monitoring clock 2 represents "0".

(c) Abnormal Mode

In an abnormal mode in which the number of clock signals is small, for instance, in the case that only 7 subject clock signals are present during a time period in which the outputted frequency-divided monitoring clock signal 2 indicates "0", "1" is inputted only to the first to seventh columns of the shift register 4 when the subject clock signals 1 are inputted. Thus, the normal value detecting circuit 6A does not sets the SR-flipflop 6C at "1". Needless to say, the abnormal value detecting circuit 6B does not operate. When the monitoring clock signal 2 changes to "1" in this state, the negative logical resultant output of the D-flipflop 5D becomes "1" at the trailing edge thereof. The abnormal value is maintained until the monitoring clock signal 2 changes to "0" the next time and the value is changed to a normal one. Thus, the alarm circuit 9 indicates "1".

In contrast, in the case of an abnormal mode in which the number of clock signals is large, for example, in the case that 9 monitored clock pulses 1 are present during the output frequency-divided monitoring clock signal 2 represents "1", the value "1" is inputted to the first to ninth columns of the shift register 4 in response to the input of the subject clock signal 1. In this case, when "1" is inputted to the first to eighth columns of the shift register 4, the normal value detecting circuit 5A sets the SR-flipflop 5C at "1". However, this flipflop is reset according to a detection output of the abnormal value detecting circuit 5B, so that the output of the SR-flipflop 5C is returned to "0" again. When the monitoring clock 2 changes to "0" in this state, the negative logical resultant output of the D-flipflop 5D becomes "1" at the trailing edge of the monitoring clock signal 2. The abnormal value is maintained until the monitoring clock 2 becomes "1" the next time and is in a normal mode. The alarm circuit 9 indicates "1".

Further, when an interruption or abnormality of the clock signal occurs, for example, when the value "1" is not inputted to the shift register 4 during the output frequency-divided monitoring clock 2 indicates "1", the normal value detecting circuit 5A does not set the SR-flipflop 5C at "1". Thus, the abnormal mode is maintained until. the value represented by the monitoring clock signal 2 becomes "1", which is a normal one, the next time. Consequently, the value indicated by the alarm circuit. 9 becomes "1".

Incidentally, after the abnormal value is detected, the state of the clock signal is. not returned to a normal state when a normal monitoring clock signal is inputted thereto during (5/2)cycles of the cycle of the monitoring clock signal.

(B-3) Advantages of Second Embodiment

As described above, according to the second embodiment of the invention, the detecting circuit comprises the two shift registers 4 and 10, which receive results of frequency division of the monitoring clock signals as the reset input or the set input thereto and also receive data "1" or "0" by receiving the subject clock signal, and the two abnormal evaluation circuits 5 and 6 that employ one cycle of the monitoring clock signal as the monitoring interval. Further, two pairs of the single register and the single abnormality evaluation circuit alternately perform an operation of inputting a signal outputted from the single shift register thereto and monitoring the outputted signal during the monitoring clock signal indicates "0" or "1". Consequently, the detecting circuit always monitors and detects an occurrence of abnormality of the clock signal.

Moreover, the second embodiment constitutes each of the normal value detecting circuit and the abnormal value detecting circuit by an edge detecting circuit, differently from the first embodiment of the invention. Therefore, the gate size and the power consumption of the detecting circuit according to the second embodiment are reduced.

(C) Third Embodiment (C-1) Device Configuration

Figure 5:
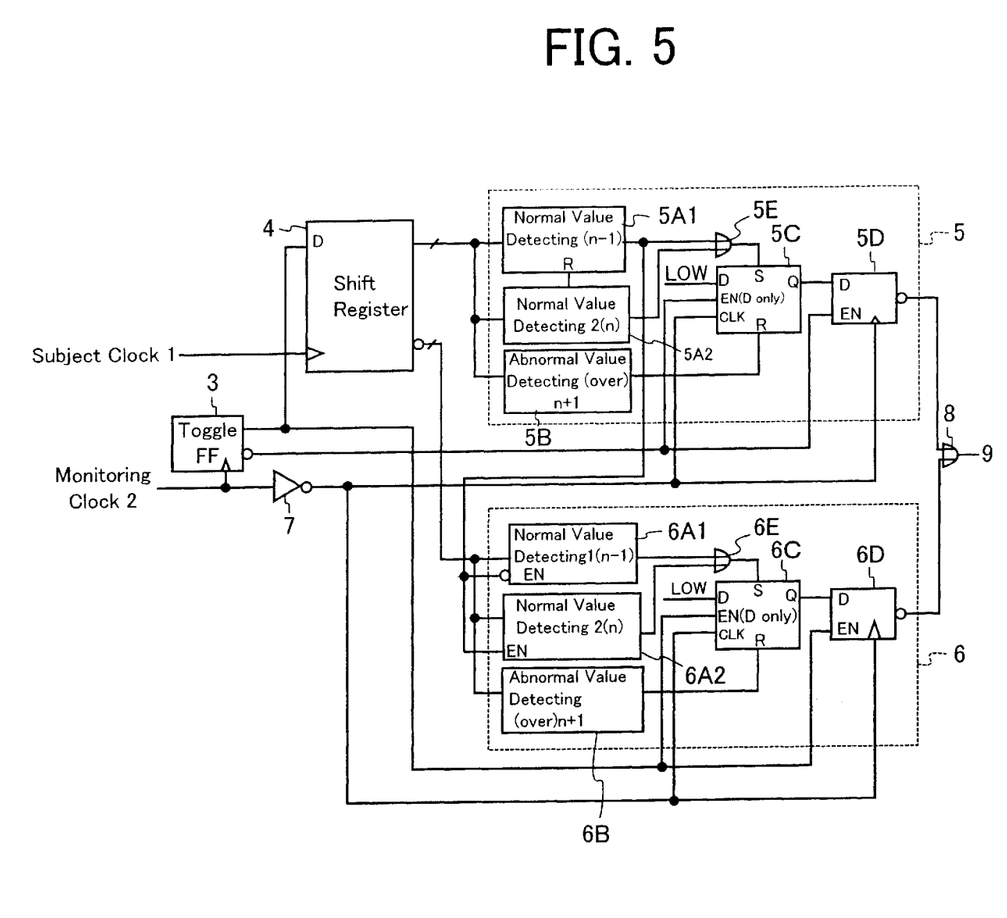
FIG. 5 is a functional block diagram illustrating a clock abnormality detecting circuit that is a third embodiment of the invention.

FIG. 5 illustrates a third embodiment of the invention. Incidentally, FIG. 5 functionally illustrates the circuit configuration of a clock abnormality detecting circuit embodying the invention, similarly as FIG. 1. Third embodiment has a plurality of (that is, two in the case of the example of FIG. 5) abnormality evaluation circuits 5 described in the foregoing description of the first embodiment. Further, a result of detection of a normal value, which is performed by one of the abnormality evaluation circuits, is stored. Moreover, the result outputted therefrom is connected to the abnormality evaluation circuit 6. This enables a evaluating operation of the circuit 6 under a condition that differs from the condition employed by the abnormality evaluation circuit 5.

The third embodiment employs such a configuration because this embodiment assumes that the frequency of the subject clock signal is not exactly divided by the frequency of the monitoring clock, differently from the first and second embodiments.

For example, when the frequency of the subject clock signal cannot exactly be divided by the monitoring clock signal even in the case that the frequency of the monitoring clock signal is nearly (⅛) the frequency of the subject clock signal, similarly as in the case of the first embodiment, there is the necessity for determining that the monitored clock signal is normal both in the case when an integral quotient is 7, and the case when the integral quotient is 8.

Incidentally, there is a case that the lack of two consecutive clock pulses cannot be monitored by simply increasing the number of the normal value detecting circuits described in the foregoing description of the first embodiment.

Thus, in the case of the third embodiment, to enable the clock abnormality detecting circuit to detect an interruption or abnormality of a clock signal every cycle of the clock signal even in the case that the monitoring clock signal and the subject clock signal are asynchronous to each other, and that the frequency of the subject clock signal is not exactly divided by the frequency of the monitoring clock signal, when the abnormality evaluation circuit 5 ascertains that the monitored clock signal is normal, on the conditions set by the normal value detecting circuit 5A1, the normal value detecting circuit 6A of the abnormality evaluating circuit 6, which operates complementarily, is inhibited from operating. That is, it is determined only by the normal value detecting circuit 6A2 whether or not the monitored clock signal is normal.

Needless to say, in the case when the abnormality evaluation circuit 5 ascertains that the monitored clock signal is normal, on the condition set by the normal value detecting circuit 5A2, the normal value detecting circuit 6A2 of the abnormality evaluation circuit 6, which operates complementarily, the normal value detecting circuit 6A2 is inhibited from operating. That is, it is determined only by the normal value detecting circuit 6A1 whether or not the monitored clock signal is normal.

Practically, each of the abnormality evaluation circuits 5 and 6 employs the following configuration. Incidentally, needless to say, such a configuration is described as a mere example. The configuration of the detecting circuit of the invention is not limited to that of this embodiment.

First, the configuration of the abnormality evaluation circuit 5 is described hereinbelow. This abnormality evaluation circuit 5 comprises a first normal value detecting circuit 5A1, a second normal value detecting circuit 5A2, an SR-flipflop 5C, a D-flipflop 5D, and an OR circuit 5E.

Incidentally, the first normal value detecting circuit 5A1 is an operational circuit for obtaining AND of all outputs of the D-flipflops placed at the first to (n−1)th columns in the case that the number of columns of D-flipflops of the shift register 4 is (n+1). Additionally, the first normal value detecting circuit 5A1 is reset when "1" is outputted by the second normal value detecting circuit 5A2. Further, the output of the circuit 5A1 is connected to the OR circuit 5E. Moreover, the output signal of the circuit 5A1 is sent to the abnormality evaluation circuit 6. The connection therebetween will be described later in detail.

The second normal value detecting circuit 5A2 is an operational circuit for obtaining AND of all outputs of the D-flipflops placed at the first to nth columns in the case that the number of columns of D-flipflops of the shift register 4 is (n+1). The output of the circuit 5A2 is inputted to the OR-circuit 5E. Furthermore, as described above, the circuit 5A2 is adapted to reset an output of the first normal value detecting circuit 5A1 when "1" is obtained as an output of the circuit 5A2.

This reset function enables the circuit 5A1 to maintain an output thereof at "1" in the case that the monitored clock signal meets the condition set by the first normal value detecting circuit 5A1 and is ascertained to be normal (that is, the (n−1)th clock pulse is ascertained by the circuit 5 to be normal) when a circuit for performing the function of determining the presence/absence of an abnormality of the clock signal is changed from the abnormality evaluation circuit 5 to the abnormality evaluation circuit 6. Moreover, this reset function also enables the resetting of an output of the first normal value detecting circuit 5A1 to "0" in the case that the monitored clock signal meets the condition set by the second normal value detecting circuit 5A2 and is ascertained to be normal (that is, the nth clock pulse is ascertained by the circuit 5 to be normal).

The SR-flipflop 5C is a circuit that employs an output of one of the circuits 5A1 and 5A2 as the set input signal thereto and that employs an output of the abnormal value detecting circuit 5B as the reset input signal thereto. Incidentally, a fixed voltage (having L-level in this case) is inputted to the data input terminal thereof. Further, a negative output of the frequency dividing circuit 3 is inputted to the enable terminal thereof. Furthermore, an output of the clock signal inverting device 7 is inputted to the clear terminal thereof.

The D-flipflop 5D is a circuit that employs an output of the SR-flipflop 5C as the data input signal thereto. Incidentally, a negative output of the circuit 3 is inputted to the enable terminal thereof. Further, an output of the clock signal inverting device 7 is inputted to the clock input terminal thereof. Data obtained by inverting an output of the flipflop 5D is inputted to the other input terminal of the OR circuit 8.

The OR circuit 5E is a circuit for providing OR of outputs of the circuits 5A1 and 5A2 to the set input terminal of the SR-flipflop 5C.

Next, the configuration of the abnormality evaluating circuit 6 is described hereinbelow. Fundamentally, the configuration of this circuit 6 is the same as that of the abnormality evaluation circuit 5. That is, the circuit 6 comprises a first normal value detecting circuit 6A1, a second normal value detecting circuit 6A2, an SR-flipflop 6C, a D-flipflop circuit 6D, and an OR circuit 6E. The circuit 6 differs from the circuit 5 in respects related to the input signals and in that the enable terminals are provided in the circuits 6A1 and 6A2, respectively.

The first normal value detecting. circuit 6A1 is an operational circuit for obtaining AND of all outputs of the D-flip flops placed at the first to (n−1)th columns in the case that the number of columns of D-flipflops of the shift register 4 is (n+1). Incidentally, although the positive output of the shift register 4 is inputted to the first normal value detecting circuit 5A1, a negative output of the shift register 4 is inputted to the circuit 6A1. Moreover, a signal obtained by inverting the output signal of the circuit 5A1 of the circuit 5 is connected and provided to the enable terminal of the circuit 6A1.

On the other hand, the second normal value detecting circuit 5A2 is an operational circuit for obtaining AND of all outputs of the D-flipflops placed at the first to nth columns in the case that the number of columns of D-flipflops of the shift register 4 is (n+1). Incidentally, although the input to the second normal value detecting circuit 5A2 is a positive output of the shift register 4, the input to the second normal value detecting circuit 6A2 is a negative output of the shift register 4. Furthermore, an output of the circuit 5A1 of the circuit 5 is directly given to the enable terminal thereof. Thus, only the normal value detecting circuit, whose established conditions for detecting a normal value, which differ from such conditions set by the circuit 6, can operate.

The abnormal value detecting circuit 6B is an operational circuit for obtaining AND of all outputs of the D-flipflops placed at the first to (n+1)th columns in the case that the number of columns of D-flipflops of the shift register 4 is (n+1). The input to the circuit 6B is a negative output of the shift register 4.

The SR-flipflop 6C is a circuit that employs an output of one of the circuits 6A1 and 6A2 as the set input signal thereto and that employs an output of the abnormal value detecting circuit 6B as the reset input signal thereto. Incidentally, a fixed voltage (having L-level in this case) is inputted to the data input terminal thereof. Further, an output of the clock signal inverting device 7 is inputted to the clear terminal thereof. Furthermore, a positive output of the frequency dividing circuit 3 is inputted to the enable terminal thereof.

The D-flipflop 6D is a circuit that employs an output of the SR-flipflop 6C as the data input signal thereto. Incidentally, the flipflop 6C differs from the flipflop 5C only in that a positive output of the circuit 3 is inputted to the enable terminal thereof. Further, an, output of the clock signal inverting device 7 is inputted to the clock input terminal thereof. Moreover, data obtained by inverting an output of the flipflop 5D is inputted to the other input terminal of the OR circuit 8.

The OR circuit 6E is a circuit for providing OR of outputs of the circuits 6A1 and 6A2 to the set input terminal of the SR-flipflop 6C.

The rest of the configuration of the third embodiment is similar to the corresponding part of the configuration of the first embodiment of the invention.

(C-2) Abnormality Detecting Operation

As described above, the clock abnormality detecting circuit also enables the detection of abnormality of a clock signal, which includes the interruption of a clock signal, every cycle of the clock signal even in the case that the subject clock signal and the monitoring clock are asynchronous to each other, and that the frequency of the subject clock signal is not exactly divided by the frequency of the monitoring clock signal.

Even in the case of this clock abnormality detecting circuit, the following description is given by assuming that the cycle of the monitoring clock signal is equal to the cycle of the subject clock signal, whose frequency is divided by 8.

Therefore, in the case of the shift register 4, the number of columns of this register is assumed to be set at 9 (=8+1).

(a) Reset Mode

Although not shown in this figure, outputs of all columns of the register 4 are "0" when reset. At that time, an output of the abnormality evaluation circuit 5 causes issuance of a clock interruption alarm (that is, the negative logical output of the D-flipflop 5D indicates a logical value "1"). Further, an output of the frequency dividing circuit 3 for frequency-dividing a monitoring clock signal indicates "0". Therefore, another circuit configured in such a manner as to prevent an alarm from being issued on resetting the register is provided in a communication unit.

(b) Normal Mode

After the resetting is canceled, an output of the frequency dividing circuit 3 for frequency-dividing the monitoring clock signal is changed from "0" to "1" by inputting the monitoring clock 2. At that time, data representing a result of frequency division of the monitoring clock signal 2 is sequentially inputted to the data input terminal of the shift register 4 by inputting the subject clock signal 1 thereto.

When the subject clock signal 1 is normally inputted thereto, data "1" is inputted to the first to seventh columns of the shift register 4 in response to the input of the subject clock signal 1. In this case, for example, in the case that the normal value detecting circuit 5A1 is an operational circuit for obtaining AND of all outputs of the first to seventh columns of the shift register 4, when "1" is set at the first to seventh columns of the shift register 4, the SR-flipflop 5C is set and indicates "1".

Incidentally, a storage circuit (not shown) is provided in the output column of the normal value detecting circuit 5A1. Thus, a result of the detection of the normal value is held therein.

On the other hand, in the case that the normal value detecting circuit 5A2 is an operational circuit for obtaining AND of outputs of all the first to eighth columns of the shift register, the aforementioned storage circuit is reset when the normal value detecting circuit 5A2 outputs a signal representing "1". This is because of the necessity for informing the circuit 6, which operates complementarily, of the fact that "1" is inputted to the first to eighth column of the shift register 4, when such a fact is known.

Incidentally, in the third embodiment, it is assumed that the outputted frequency-divided monitoring clock signal 2 is produced so that the number of the subject clock pulses, which should be present during such a signal 2 represents "1", and so that the number of the subject clock pulses, which should be present during such a signal 2 represents "0".

Then, an output of the normal value detecting circuit 5A1 of the abnormality evaluation circuit 5 becomes "1" during one cycle of the subject clock signal 1. Both of the values respectively indicated by the flipflop 5C and the storage circuit are "1". At that time, the normal value detecting circuit 5A2 does not operate at all because the number of the clock pulses 1, which are inputted during the outputted frequency-divided monitoring clock 2 is "1", is not 8. Thus, the storage circuit storing the result of the detection of the normal value is not reset.

Incidentally, in this case, in the case that the abnormally value detecting circuit 5B is an operational circuit for obtaining AND of outputs of all the first to ninth columns of the shift register 4, the frequency-divided resultant monitoring clock pulses 2 is already "0" at the next input of the clock signal subject. Consequently, the circuit 5B does not operate at all.

Moreover, at that time, a negative output (that is, an output corresponding to "0") of the shift register 4 is given to the abnormality evaluation circuit 6, which thus does not operate at all. Therefore, the normal or abnormal state of the preceding value is maintained.

Further, consider the case that "0" is inputted to the first to eighth columns of the shift register 4 by inputting the clock signal 1 subject. At that time, a value obtained by inverting data indicating the result of the decision made by the abnormal value detecting circuit 5 is given to the normal value detecting circuit 6A1 of the abnormal evaluation circuit 6. That is, the circuit 6A1 is in a disabled state. Thus, only the normal value detecting circuit 6A2 indicates "1" during one cycle of the clock signal 1 subject. Thus, the SR-flipflop 6C is set at "1".

That is, the normal value detecting circuit 6A2, which determines the clock signal 1 as normal when the number of clock pulses 1 subject is 8 during the output frequency-divided monitoring clock signal 2 represents "0", operates and sets data, which indicates that the monitored clock signal 1 is normal, in the SR-flipflop 6C.

An operation performed by the third embodiment after that is similar to the corresponding part of the operation of the first embodiment.

(c) Abnormal Mode

An operation of the third embodiment in an abnormal mode is similar to that of the first embodiment in such a mode. The storage circuit of the normal value detecting circuit 5A1 holds the normal preceding value.

Incidentally, in the worst case, after the abnormal value is detected, the state of the clock signal is not returned to a normal state when a normal monitoring clock signal is inputted thereto during (7/2)cycles of the cycle of the monitoring clock signal.

(C-3) Advantages of Third Embodiment

As described above, according to the third embodiment of the invention, a circuit for holding a result of detection of a normal value is added to the detecting circuit according to the first embodiment. This enables the detection of an abnormality, which includes an interruption, of a clock signal every cycle of the clock signal even in the case that the monitoring clock and the subject clock signal are asynchronous to each other, and that the frequency of the subject clock signal is not exactly divided by the frequency of the monitoring clock.

(D) Other Embodiments

Although it has been described in the foregoing description of the second embodiment that data representing the result of the frequency division of the monitoring clock is used as the reset input data to be inputted to each of the columns Of the shift register, in short, such data may be used as the loading input data or as the enable input data.

Although it has been described in-the foregoing description of the second embodiment that the normal value detecting circuit and the abnormal value detecting circuit are constituted by edge detection circuits, the normal value detecting circuit and the abnormal value detecting circuit may be constituted by AND circuits.

Although the storage circuit for storing normal values is provided in the normal value detecting circuit 5A1 in the third embodiment of the invention, the storage circuit may be provided in another of the normal value detecting circuits.

Figure 6:
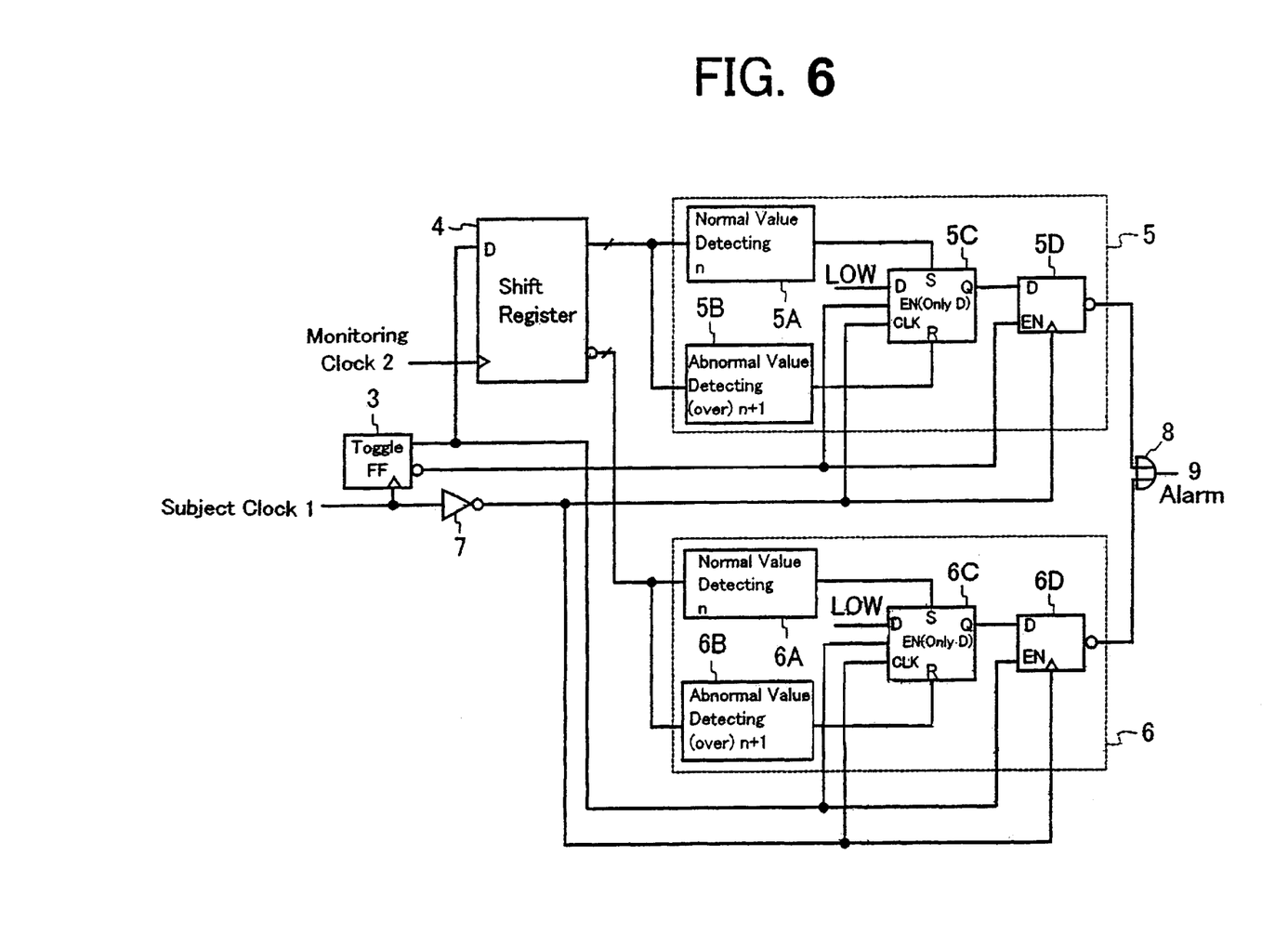
FIG. 6 is a functional block diagram illustrating a modification of the embodiment shown in FIG. 1.
Figure 7:
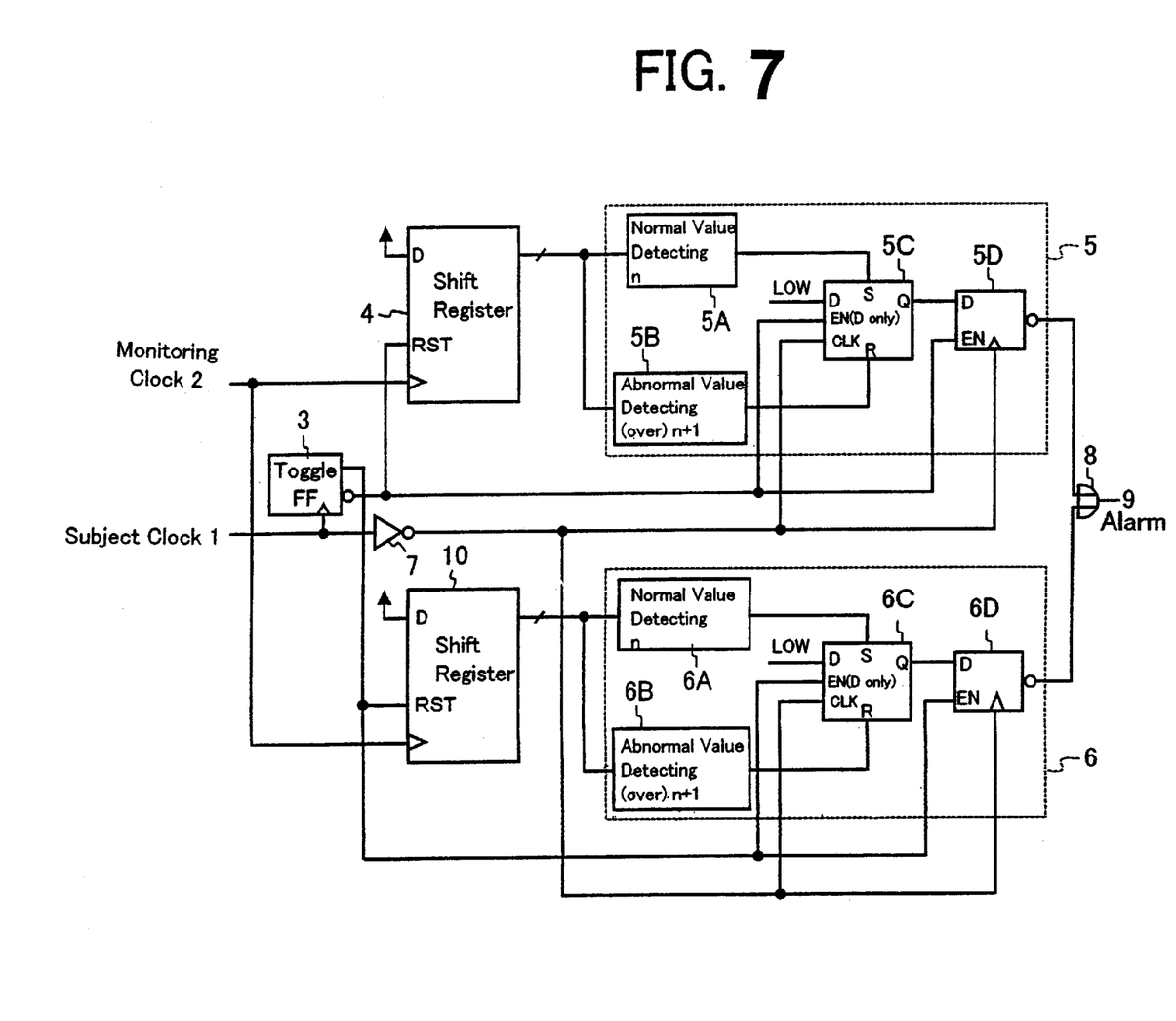
FIG. 7 is a functional block diagram illustrating a modification of the embodiment shown in FIG. 3.

Although it has been described in the foregoing description of the first to third embodiments that the clock signal subject is used as a shifting clock signal for the shift register, and that the monitoring interval is changed according to the output frequency-divided clock signal subject, the detecting circuit may be configured by reversing the relation between the monitoring clock signal and the subject clock signal. Such an arrangement is shown in FIG. 6, where it will be seen that an embodiment corresponding to the one shown in FIG. 1 has a shift register 4 that receives the monitoring clock signal 2 rather than the subject clock signal 1, and a frequency dividing circuit 3 that receives the subject clock signal 2 rather than the monitoring clock signal 2. Similarly, FIG. 7 shows an embodiment corresponding to the one in FIG. 3, but with the relationship between the monitoring clock signal and the subject clock signal reversed.

Although it has been described in the foregoing description of the first to third embodiments that the clock signal subject and the monitoring clock signal are asynchronous to each other, and that the frequency of the clock signal subject is higher than the frequency of the monitoring clock signal, the clock signal subject and the monitoring clock signal may be synchronous to each other. Further, any other relation between the frequency of the clock signal subject and the frequency of the monitoring clock signal may be employed in the detecting circuit of the invention.

Although the preferred embodiments of the present invention have been described above, it should be understood that the present invention is not limited thereto and that other modifications will be apparent to those skilled in the art without departing from the sprint of the invention.

The scope of the present invention, there fore, should be determined solely by the appended claims.

What is claimed is:

1. A circuit for detecting abnormality of a subject clock signal, comprising:
a frequency-dividing circuit for frequency-dividing a monitoring clock signal to provide a frequency-divided monitoring clock signal;
a shift register which stores the frequency-divided monitoring clock signal in synchronization with the subject clock signal; and
a plurality of abnormality evaluation circuits which operate complementarily each to other in accordance with an output signal of the shift register and detect abnormality of the subject clock signal for a period of time corresponding to a cycle of the monitoring clock signal;
wherein each of the abnormality evaluation circuits comprises a normal value detecting circuit having an input port connected to an output port of the shift register, and an abnormal value detecting circuit having an input port connected to the output port of the shift register.

2. A circuit according to claim 1, further comprising:
a circuit for providing a logical sum of output data supplied from the evaluation circuits.

3. A circuit according to claim 1, wherein the shift register has a data input terminal connected to the frequency dividing circuit, a clock terminal supplied with the subject clock signal, a positive output port connected to one of the abnormality evaluation circuits, and a negative output port connected to another abnormality evaluation circuit.

4. A circuit according to claim 1, wherein
each of the normal value detecting circuits detects a normal output state in accordance with output states of each of the stages of the shift register; and
each of the abnormal value detecting circuits detects an abnormal clock input signal, whose value exceeds a normal input value, in accordance with output states of each of the stages of the shift register.

5. A clock abnormality detecting circuit for detecting abnormality of a subject clock signal by using a monitoring clock signal, the clock abnormality detecting circuit comprising:
a frequency dividing circuit for frequency-dividing the subject clock signal and for outputting a frequency-divided subject clock signal;
a shift register for shifting the frequency-divided subject clock signal inputted from the frequency dividing circuit;
a plurality of abnormality evaluation circuits, adapted to complementarily operate by employing one period of the frequency-divided subject clock signal as an evaluation interval, for evaluating the monitoring clock signal and for outputting an abnormality signal if an abnormality is detected; and
an operation circuit for computing a logical sum of data representing results of evaluations performed by the plurality of abnormality evaluation circuits.

6. A circuit for detecting abnormality of a subject clock signal, comprising:
a frequency dividing circuit for frequency-dividing a monitoring clock signal to provide a frequency-divided monitoring clock signal;
first and second shift registers each of which operates in synchronization with the subject clock signal and is reset in accordance with the frequency divided monitoring clock signal; and
first and second abnormality evaluation circuits which operate complementarily each other in accordance with output signals of the first and second shift registers, respectively, and detect abnormality of the subject clock signal for a period of time corresponding to a cycle of the monitoring clock signal.

7. A circuit according to claim 6, wherein:
the first abnormality evaluation circuit comprises a normal value detecting circuit having an input port connected to an output port of the first shift register and an abnormal value detecting circuit having an input port connected to the output port of the first shift register, and
the second abnormality evaluation circuit comprises a normal value detecting circuit having an input port connected to an output port of the second shift register and an abnormal value detecting circuit having an input port connected to the output port of the second shift register.

8. A circuit according to claim 7, wherein:

each of the normal value detecting circuits detects a normal output state in accordance with output states of each of the stages of the corresponding shift register; and each of the abnormal value detecting circuits detects an abnormal clock input signal, whose value exceeds a normal input value, in accordance with output states of each of the stages of the corresponding shift register.

9. A circuit according to claim 6, wherein the first shift register has a clock terminal supplied with the subject clock signal and a reset terminal connected to a negative output terminal of the frequency dividing circuit, and the second shift register has a clock terminal supplied with the subject clock signal and a reset terminal connected to a positive output terminal of the frequency dividing circuit.

10. A circuit for detecting abnormality of a subject clock signal, comprising:

a frequency dividing circuit for frequency-dividing a monitoring clock signal to provide a frequency-divided monitoring clock signal;

a shift register which stores the frequency-divided monitoring clock signal in synchronization with the subject clock signal; and a plurality of abnormality evaluation circuits which operate complementarily each other and detect abnormality of the subject clock signal in accordance with an output signal of the shift register for a period of time corresponding to a cycle of the monitoring clock signal, wherein each of the abnormality evaluation circuits has first and second normal value detecting circuits and an abnormal value detecting circuit.

11. A circuit according to claim 10, wherein:

each of the normal value detecting circuit detects a normal output state in accordance with output states of each of the stages of the shift register; and each of the abnormal value detecting circuit detects an abnormal clock input signal, whose value exceeds a normal input value, in accordance with output states of each of the stages of the shift register.

12. A circuit according to claim 11, wherein:

the shift register has a data input terminal connected to the frequency dividing circuit, a clock terminal supplied with the subject clock signal, a positive output port connected to the first abnormality evaluation circuit, and a negative output port connected to the second abnormality evaluation circuit.

13. A circuit for detecting abnormality of a subject clock signal, comprising:

a frequency dividing circuit for frequency-dividing a monitoring clock signal to provide a frequency-divided monitoring clock signal;

a shift register which stores the frequency-divided monitoring clock signal in synchronization with the subject clock signal; and a plurality of abnormality evaluation circuits which operate complementarily to each other in accordance with an output signal of the shift register and detect abnormality of the subject clock signal for a period of time corresponding to a cycle of the monitoring clock signal, wherein one of the plurality of abnormality evaluation circuits includes a plurality of normal value detecting circuits, which differ from one another in conditions for regarding a state as a normal one and are operative to detect a normal state in accordance with output states of each stage of the shift register, a storage means for storing one of results of detection performed by the plurality of normal value detecting circuits, and an abnormal value detecting circuit for detecting an abnormal clock input value that exceeds a normal input value, and wherein another of the abnormality evaluation circuit other than the one of the abnormality evaluation circuits includes a plurality of normal value detecting circuits, which differ from one another in conditions for regarding a state as a normal one and are operative to detect a normal state in accordance with output states of each stage of the shift register and which are adapted so that only the plurality of normal value detecting circuits directed to a detection of a normal output state on a condition differing from the conditions for regarding a state as a normal one according to a result stored in the storage means provided in the one of the plurality of abnormality evaluation circuits, and an abnormal value detecting circuit for detecting in accordance with an output state of each of stages of the shift register an abnormal clock input value that exceeds a normal input value.

14. A clock abnormality detecting circuit for detecting abnormality of a subject clock signal by using a monitoring clock signal, the clock abnormality detecting circuit comprising:

a frequency dividing circuit for frequency-dividing the subject clock signal and for outputting a frequency-divided subject clock signal;

a plurality of shift registers for shifting a fixed input signal, which represents 0 or 1, by using the frequency-divided subject clock signal, which is inputted from the frequency dividing circuit, as a loading input signal or as an enable input signal and by using the monitoring clock signal as a shifting clock signal;

a plurality of abnormality evaluation circuits, adapted to complementarily operate by employing one period of the frequency-divided subject clock signal as an evaluation interval, for evaluating the monitoring clock signal if an abnormality is detected; and an operation circuit for computing a logical sum of data representing results of evaluations performed by the plurality of abnormality evaluation circuits.

15. A clock abnormality detecting circuit for detecting abnormality of a subject clock signal by using a monitoring clock signal, the clock abnormality detecting circuit comprising:

a frequency dividing circuit for frequency-dividing a monitoring clock signal and for outputting a frequency-divided monitoring clock signal;

a shift register for shifting the frequency-divided monitoring clock signal inputted from the frequency dividing circuit;

a plurality of abnormality evaluation circuits, adapted to complementarily operate by employing one period of the frequency-divided monitoring clock signal as a monitoring interval, for monitoring an occurrence of interruption of the subject clock signal or generation of a clock input signal representing a value exceeding a value of a normal input signal in each monitoring interval from output states of each of the stages of the shift register, and for outputting an abnormality signal between the interruption in input of the subject clock signal and detection of a normal input value and between detection of a clock input value exceeding a normal input value and detection of a normal input value; and an operation circuit for computing a logical sum of data representing results of evaluations performed by the plurality of abnormality evaluation circuits, wherein one of the abnormality evaluation circuits includes a normal value detecting circuit for detecting a normal output state in accordance with output states of each of the stages of the shift register; and an abnormal value detecting circuit for detecting an abnormal clock input signal, whose value exceeds a normal input value, in accordance with output states of each of the stages of the shift register.

16. A clock abnormality detecting circuit for detecting abnormality of a subject clock signal by using a monitoring clock signal, the clock abnormality detecting circuit comprising:

a frequency dividing circuit for frequency-dividing a monitoring clock signal and for outputting a frequency-divided monitoring clock signal;

a shift register for shifting the frequency-divided monitoring clock signal inputted from the frequency dividing circuit;

a plurality of abnormality evaluation circuits, adapted to complementarily operate by employing one period of the frequency-divided monitoring clock signal as a monitoring interval, for monitoring an occurrence of interruption of the subject clock signal or generation of a clock input signal representing a value exceeding a value of a normal input signal in each monitoring interval from output states of each of stages of the shift register, and for outputting an abnormality signal between the interruption in input of the subject clock signal and detection of a normal input value and between detection of a clock input value exceeding a normal input value and detection of a normal input value; and an operation circuit for computing a logical sum of data representing results of evaluations performed by the plurality of abnormality evaluation circuits, wherein one of the plurality of abnormality evaluation circuits includes a plurality of normal value detecting circuits, which differ from one another in conditions for regarding a state as a normal one and are operative to detect a normal state in accordance with output states of each of stage of the shift register, a storage means for storing one of results of detection performed by the plurality of normal value detecting circuits, and an abnormal value detecting circuit for detecting an abnormal clock input value that exceeds a normal input value, and wherein another of the abnormality evaluation circuits includes a plurality of normal value detecting circuits, which differ from one another in conditions for regarding a state as a normal one and are operative to detect a normal state in accordance with output states of each of stage of the shift register and which are adapted so that only the plurality of normal value detecting circuits directed to a detection of a normal output state on a condition differing from the conditions for regarding a state as a normal one according to a result stored in the storage means provided in the one of the plurality of abnormality evaluation circuits, and an abnormal value detecting circuit for detecting in accordance with an output state of each stage of the shift register an abnormal clock input value that exceeds a normal input value.

17. A clock abnormality detecting circuit for detecting abnormality of a subject clock signal by using a monitoring clock signal, the clock abnormality detecting circuit comprising:

a frequency dividing circuit for frequency-dividing the monitoring clock signal and for outputting a frequency-divided monitoring clock signal;

a plurality of shift registers for shifting a fixed input signal, which represents 0 or 1, by using the frequency-divided monitoring clock signal, which is inputted from the frequency dividing circuit, as a loading input signal or as an enable input signal and by using the subject clock signal as a shifting clock signal;

a plurality of abnormality evaluation circuits, adapted to complementarily operate by employing one period of the frequency-divided monitoring clock signal as a monitoring interval, for monitoring an occurrence of interruption of the subject clock signal or generation of a clock input signal representing a value exceeding a value of a normal input signal in each monitoring interval from output states of each stage of a corresponding one of the plurality of shift registers, and for outputting an abnormality signal between the interruption in input of the subject clock signal and detection of a normal input value and between detection of a clock input value exceeding a normal input value and detection of a normal input value; and an operation circuit for computing a logical sum of data representing results of evaluations performed by the plurality of abnormality evaluation circuits.

18. A clock abnormality detecting circuit according to claim 17, wherein each abnormality evaluation circuit comprises:

a normal value detecting circuit for detecting a normal output state in accordance with output states of each of the stages of a respective one of the shift registers;

an abnormal value detecting circuit for detecting an abnormal clock input signal, whose value exceeds a normal input value, in accordance with output states of each of the stages of the respective one of the shift registers.

* * * * *